US005740181A

United States Patent [19]
Heikes et al.

[11] Patent Number: 5,740,181
[45] Date of Patent: Apr. 14, 1998

[54] METHOD AND APPARATUS FOR AT SPEED OBSERVABILITY OF PIPELINED CIRCUITS

[75] Inventors: Craig A. Heikes; Glenn T. Colon-Bonet, both of Fort Collins, Colo.; David R. Smentek, Columbia, Md.; Robert H. Miller, Jr., Loveland, Colo.

[73] Assignee: Hewlett-Packard Co., Palo Alto, Calif.

[21] Appl. No.: 662,403

[22] Filed: Jun. 12, 1996

[51] Int. Cl.[6] ................................................. G06F 11/00
[52] U.S. Cl. ............................................................ 371/22.3
[58] Field of Search ................................. 371/22.1, 22.3, 371/22.5, 22.6; 395/183.06

[56] References Cited

U.S. PATENT DOCUMENTS

| 5,530,706 | 6/1996 | Josephson et al. | 371/22.3 |
| 5,535,331 | 7/1996 | Swoboda et al. | 395/183 |

OTHER PUBLICATIONS

1996 IEEE Int. Solid–State Circuits Conference, pp. 354–355.
IEEE Standard Test Access Port and Boundary–Scan Architecture (IEEE Std 1149.1–1990).

*Primary Examiner*—Vincent P. Canney
*Attorney, Agent, or Firm*—Alexander J. Neudeck

[57] ABSTRACT

The operation of a pipeline is observed by launching two or more sets of data into the pipeline on consecutive clock cycles. The clock free-runs for as many cycles as it takes the data to propagate through the stages of the pipeline. The output latches of each stage of the pipeline are only sampled when the data of interest is held in each output latch, respectively. Observation may be completely controlled through a standard test access port (TAP). Observation may be accomplished by halting the clock to scan new data in and results out, or with the clock free-running. The inputs to the pipeline may come from test registers or from circuitry which feeds the pipeline during normal operation.

15 Claims, 3 Drawing Sheets

METHOD AND APPARATUS FOR AT SPEED OBSERVABILITY OF PIPELINED CIRCUITS

BACKGROUND OF THE INVENTION

1. Field of the Invention

This invention relates to the electronic testing, design for testing, debugging, and characterization of digital integrated circuits.

2. Background of the Invention

A significant cost in electronics manufacturing and development is related to some form of testing. Individual components must be tested and assembled systems must be tested. Testing may occur during product development to locate design errors and characterize the maximum and minimum operating points, and testing may occur during manufacturing to detect manufacturing defects. Circuitry for testing and characterization is typically used in a special test mode, often under static conditions. That is, the test circuitry is used to sequence an integrated circuit through states specifically for testing and the results are monitored with the system clock slowed or paused. It is also common to include circuitry to capture the state of input/output signals (called boundary scan testing.) A commonly used standard for such circuitry is IEEE Std. 1149.1-1990, IEEE Standard Test Access Port and Boundary-Scan Architecture, available from The Institute of Electrical and Electronic Engineers, Inc., 345 East 47th Street, New York, N.Y. 10017-2394. IEEE Std. 1149.1 defines a standard serial interface through which test instructions and test data are communicated. The technique involves the inclusion of a shift-register stage adjacent to each component pin of interest so that signals at component boundaries can be controlled and observed. The special shift-registers and test instructions can be used in isolated component testing and debugging, and in testing and debugging individual components assembled into larger systems.

In a typical clocked design, combinational logic circuitry is fed inputs from a set of clocked latches. These latches may be either transparent latches or master/slave type latches. Those inputs propagate through the combinational logic and outputs are captured by a set of clocked output latches. To test an individual block of circuitry on an integrated circuit, shift-register stages may be included which are used to control and observe the state of these internal latches. The values in the shift-register stages may be loaded into the input latches when the clock is pulsed. These values are then propagated through the combinational logic and captured in the output latches as the clock pulse ends.

In pipelined circuitry, each set of output latches constitutes the input latches for the next stage of the pipeline. Often, successive stages in a pipeline operate on different phases of the clock. Therefore, debugging all the stages of a pipeline must be done one stage at a time. This is necessary because the output of a stage is not known until the test of that stage is complete. The output of that stage may only then (once it is known) be used as the input to the next stage. Accordingly, to monitor the complete state of a single data set at each stage of an N-stage pipeline as it propagates through the pipeline, at least N scan tests must be run which scan out the outputs of each stage and then scan those values back in as the inputs to the next stage before the clock is pulsed to test the next stage of the pipeline. This results in long delays when the clock is held in a certain state to accommodate scanning out of the outputs of each stage and scanning in the inputs. Debugging, testing, and characterizing a chip in this manner is not only time consuming, it may mask certain types of errors. For example, a set of circuit problems may only occur when a certain sequence of inputs are sent through the pipeline on consecutive clock cycles. These problems may not occur when the clock is stopped after a single pulse and held in one state for a long time as the output of each stage is scanned out and a new set of inputs is scanned in. Finally, a typical pipeline would have shift-registers which can both monitor and control the inputs/outputs of each stage. This adds circuit complexity and cost when compared to shift-registers which only monitor each stage.

Accordingly, there is a need to monitor all the stages of a pipeline with only one scan test. There is also a need to send at least two data sets through a pipeline without halting to detect certain errors. There is a need to reduce circuit complexity by testing and/or monitoring the stages of a pipeline without having to write the input latches of each stage of the pipeline. Finally, there is a need to be able to isolate the pipeline circuitry from the rest of the chip so that the pipeline may be tested independent of the rest of the chip.

SUMMARY OF THE INVENTION

The invention observes the operation of a pipeline by launching two or more sets of data into the pipeline on consecutive clock cycles. The clock free-runs for as many cycles as it takes the data to propagate through the stages of the pipeline. The output latches of each stage of the pipeline are only sampled when the data of interest is held in each output latch, respectively. Observation may be completely controlled through a standard test access port (TAP). Observation may be accomplished by halting the clock to scan new data in and results out, or with the clock free-running. The inputs to the pipeline may come from test registers or from circuitry which feeds the pipeline during normal operation.

DETAILED DESCRIPTION OF THE PREFERRED EMBODIMENTS

Figure 1:
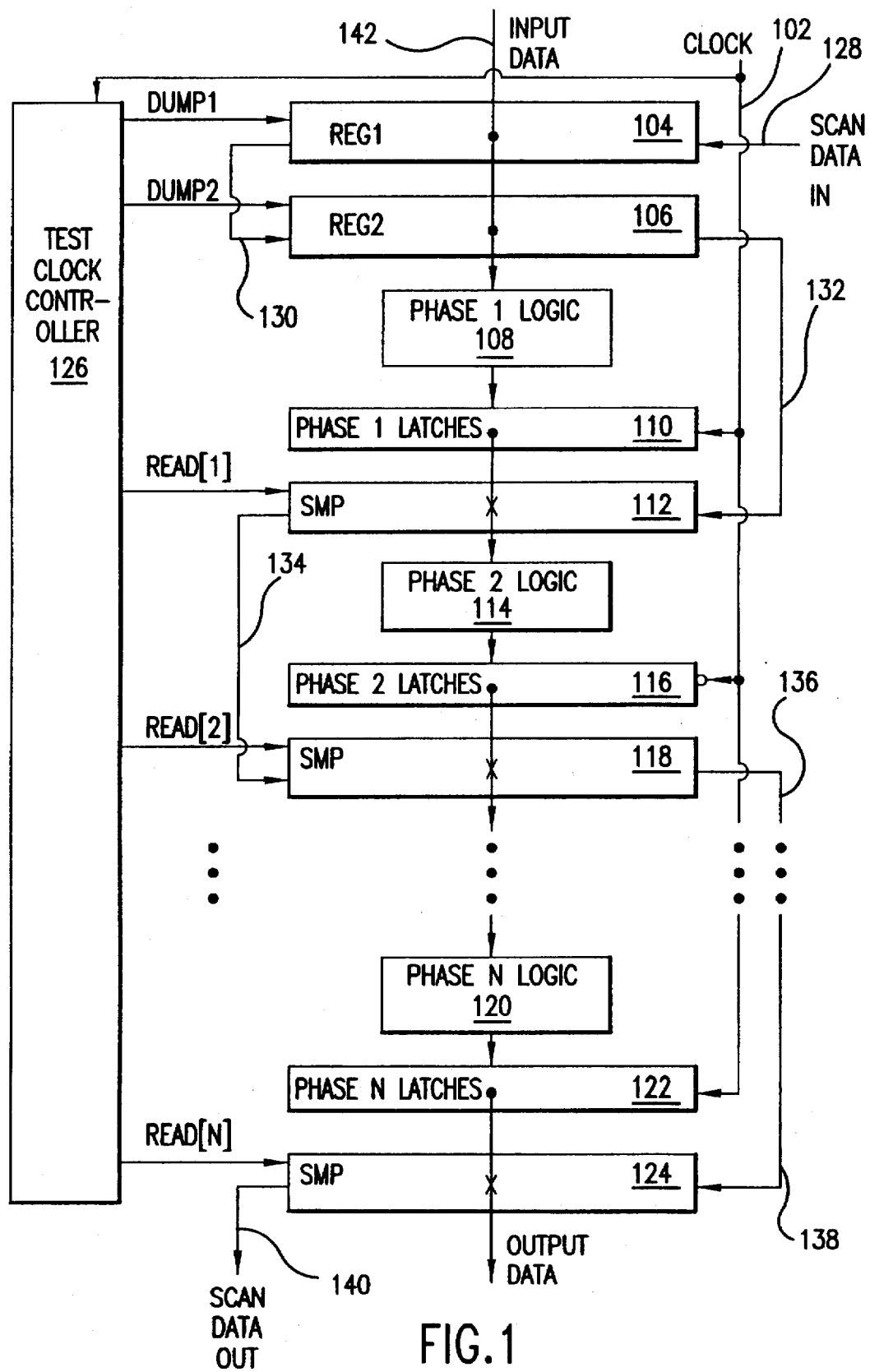
FIG. 1 depicts a pipeline and test circuitry.

FIG. 1 shows a pipeline with N number of stages. In normal operation, input data to the pipeline 142 is input to the phase 1 logic 108. The first stage is comprised of phase 1 logic 108 which operates on the inputs to the pipeline. The outputs of the phase 1 logic are latched in a set of latches 110 by the clock 102. The outputs of the phase 1 latches 110 comprise the inputs to the next stage of the pipeline. The next stage of the pipeline is comprised of phase 2 logic 114 and a set of latches 116. Each set of latches is controlled to latch by the clock 102. These latches may be transparent or edge triggered latches. If the latches are not edge triggered, and each stage of the pipeline takes one phase of the clock, the latches for consecutive pipeline stages should latch on opposite phases of the clock. This construction is repeated for each stage of the pipeline. The last stage (stage N) is comprised of phase N logic 120 and a set of phase N latches 122. The outputs of the phase N latches 122 is the output of the pipeline. The outputs of the phase 1 latches are also connected to a scannable register 112. This scannable register is comprised of a number of scan latches which capture the outputs of the phase 1 latches when the input signal READ[1] is pulsed. The outputs of the phase 2 latches are likewise connected to, and captured by a scannable register 118 when the signal READ[2] is pulsed. This construction is repeated for each stage of the pipeline. The outputs of each stage are connected to, and captured by a scannable register. Each scannable register 112, 118, 124, captures the outputs of a stage of the pipeline when its respective SMP input is pulsed. Accordingly, the outputs from the last stage of the pipeline are captured by scannable register 124 when the READ[N] signal is pulsed. The inputs to the pipeline may be provided by two registers, REG1 104 and REG2 106. REG1 and REG2 have tri-state outputs which only dump when the signals DUMP1 or DUMP2 are asserted, respectively. The data in registers REG1 104 and REG2 106 is scanned in via the chip's TAP. Once data has been captured in each scannable register 112, 118 and 124, it may be scanned out of the chip via the TAP. The scan chain is shown in FIG. 1 as the scannable registers 104, 106, 112, 118 and 124, connected in series by elements 128, 130, 132, 134, 136, 138, and 140. Each of these scannable registers 104, 106, 112, 118 and 124, may be constructed to capture any number of bits of information. Typically, the number of bits in the scannable registers 104, 106, 112, 118 and 124 would correspond to the number of outputs, or inputs there are at the stage of the pipeline which is being captured or input. A pair of scan clocks, generated by the TAP, are typically used to advance data along the scan chain. Arrow 128 illustrates the input to the scan chain which comes from the TAP. Arrow 140 illustrates the output of the scan chain going back to the TAP.

FIG. 1 shows a system where the pipeline being observed may be isolated by shutting off the circuitry which would drive the pipeline in normal operation. Alternatively, the rest of the chip could be left running, or in no special state, and a multiplexor could be inserted on all the inputs to the pipeline. This multiplexor would switch between the test inputs when the circuit was being tested, and the normal inputs when the chip was in normal operation.

Another alternative is to leave the chip in normal operation and start the sampling of the outputs of the stages upon the happening of a certain event. Accordingly, the invention provides for propagating data into the pipeline from REG1 104, REG2 106, and/or the normal inputs 142. The trigger for starting the sampling could be a transition on an input to the TAP, an internal counter reaching a certain value, or some other means. Non-destructive sampling while the chip is in normal operation is called sample-on-the-fly. Sample-on-the-fly is described in U.S. patent application Ser. No. 08/539,382, Josephson et al. The present invention can start its process of sampling the outputs of the pipeline upon the occurrence of an event which triggers sample-on-the-fly. Instead of taking a snapshot at the instant the triggering event occurs, however, the present invention can initiate its process of sampling. This allows the data at the inputs to the pipeline when the triggering event occurred to be observed as it propagates through the pipeline.

Figure 2:
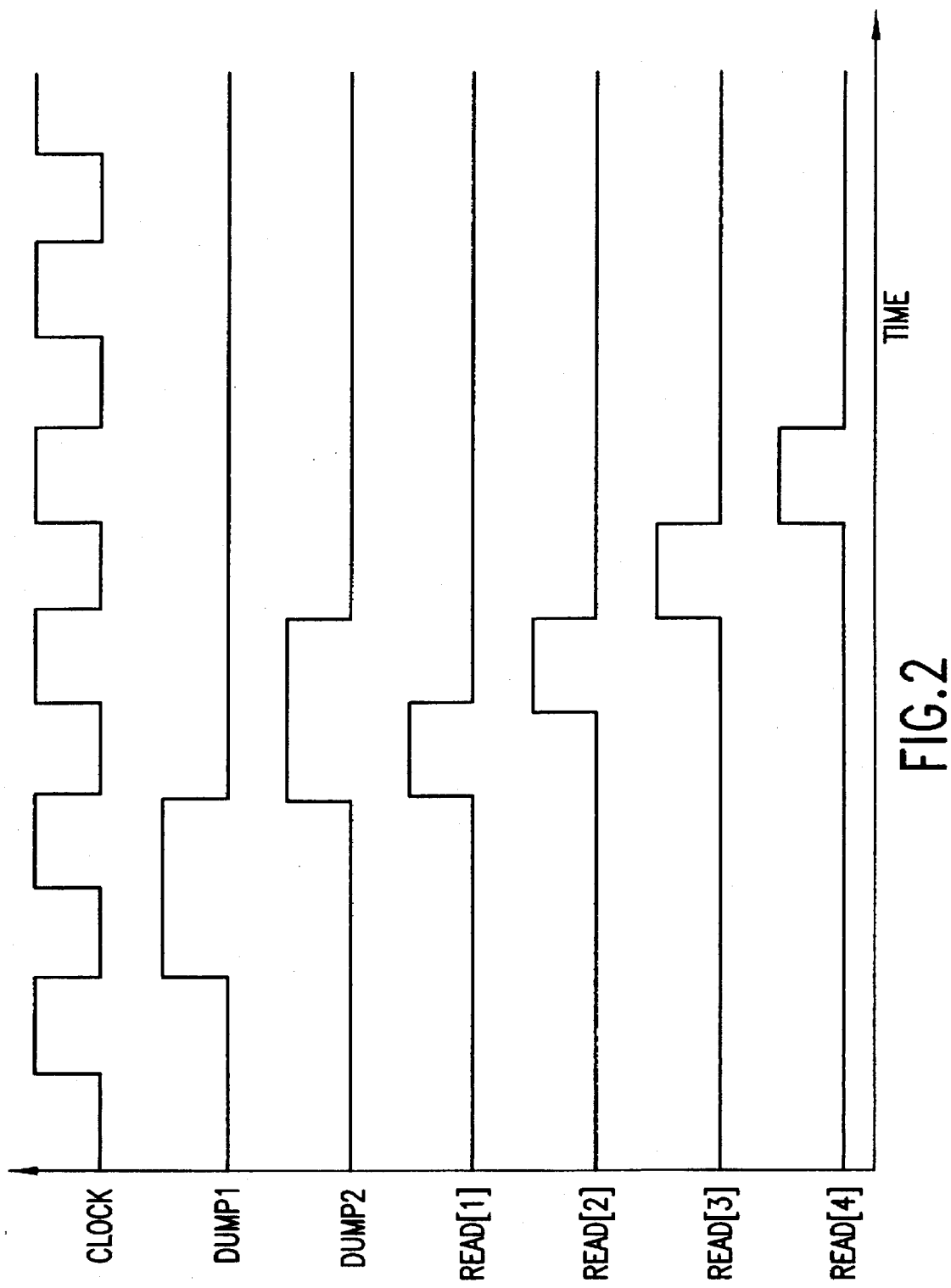
FIG. 2 is a timing diagram showing a representative set of signals in FIG. 1 which capture the pipeline state for the first set of input data.

The signals DUMP1, DUMP2, and READ[1] through READ[N] are generated by a Test Clock Controller 126. Representative timing for the signals generated by the Test Clock Controller suitable for sampling the outputs of each stage of the pipeline associated with the first set of inputs is shown in FIG. 2. In FIG. 2, DUMP1 is the first signal pulsed. This causes REG1 to dump it's contents into the phase 1 logic 108. The inputs to the phase 1 logic are processed by that logic and the outputs from the phase 1 logic are captured by the phase 1 latches 110. After the DUMP1 pulse is complete, DUMP2 is pulsed. This causes REG2 to dump it's contents into the phase 1 logic 108. After the outputs from the phase 1 logic are captured in the phase 1 latches, the Test Clock Controller 126 pulses READ[1] for one clock phase. This causes the contents of the phase 1 latches to be copied by the scannable register 112. The contents of the scan latches which make up the scannable register 112 match that of the phase 1 latches 110 in response to the inputs provided by REG1 followed by the inputs provided by REG2. Since the inputs provided by REG2 are following those provided by REG1, the outputs of the phase 1 logic in response to the input from REG1 are replaced in the phase 1 latches 110 by the outputs of the phase 1 logic in response to the inputs provided by REG2 one clock cycle later. Therefore, to capture the first stage of the pipeline's response to the contents of REG1, the READ[1] signal must be pulsed while the phase 1 latches 110 contain that response. In the alternative, if the pipeline's response to the REG2 inputs following the REG1 inputs were desired, READ[1] could be pulsed while the phase 1 latches contain that response.

Figure 3:
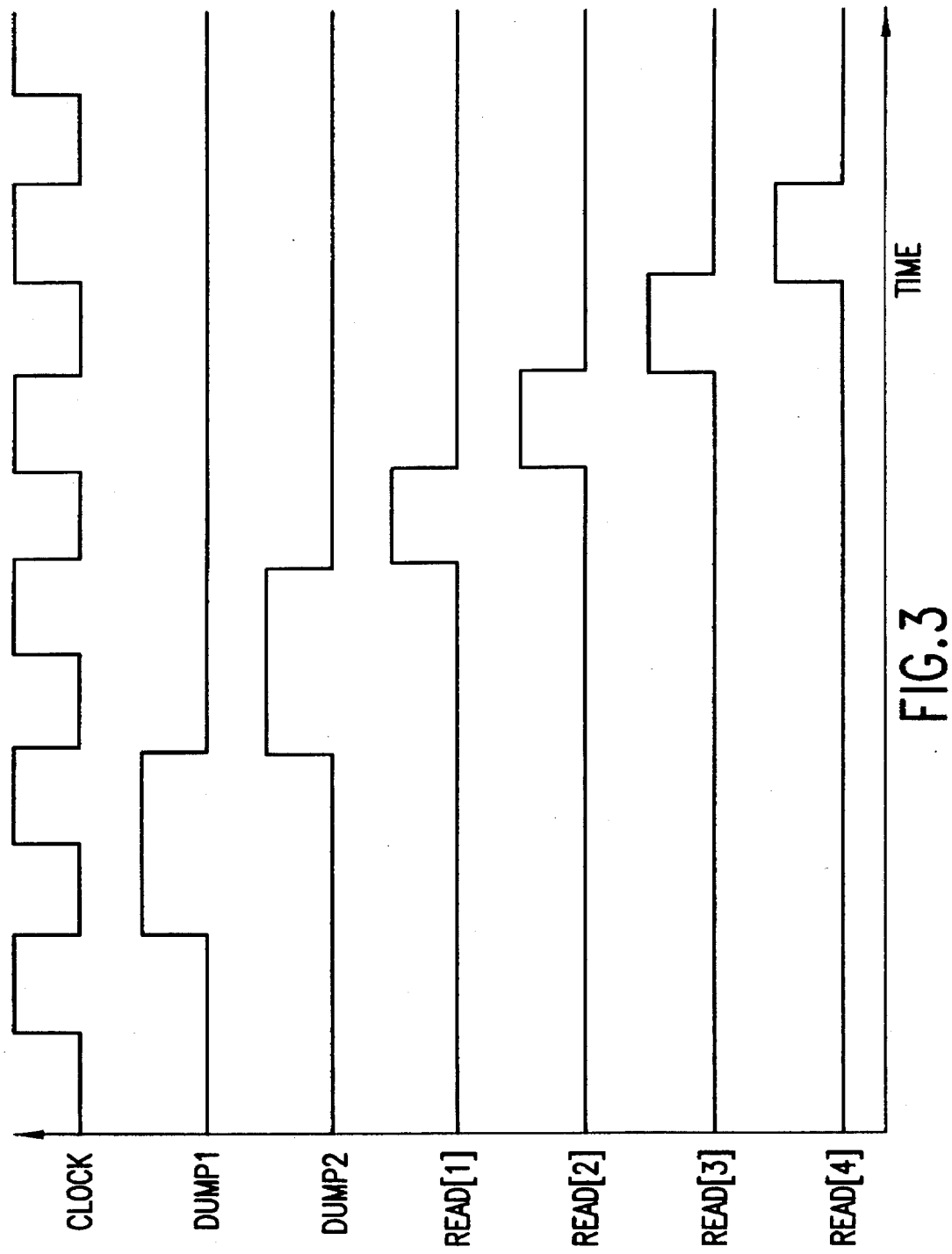
FIG. 3 is a timing diagram showing a representative set of signals in FIG. 1 which capture the pipeline state for the second set of input data.

As the outputs from the phase 1 logic are captured by the phase 1 latches 110, they are also propagated to the phase 2 logic 114 as inputs to that logic. One clock phase later, the outputs of the phase 2 logic are captured in the phase 2 latches 116. This process is repeated for each stage of the pipeline. Accordingly, to capture the data from each stage of the pipeline in response to the REG1 inputs to the pipeline, the scannable register 112, 118 or 124 coupled to each stage of the pipeline has it's SMP input pulsed at the time when that stage contains it's response to the REG1 inputs. Likewise, if it were the second piece of data, from REG2 106, that was of interest, the SMP inputs to the scannable registers could be pulsed to capture this data. Typically, the pulses to capture the response to the inputs from REG2 106 would be 1 clock cycle later than the pulses to capture the response to the inputs from REG1 104. Representative timing for this case is shown in FIG. 3.

Once the inputs from REG1 104 and REG2 106 have propagated completely through the pipeline, the contents of the scannable registers may be examined by scanning the data out of the chip via the TAP. Note that the response of all the stages of the pipeline associated with one piece of data (either that of the contents of REG1 104 or REG2 106) will be obtainable by running a single test and scanning out the contents of a single scan chain one time. Furthermore, complex interactions between successive pieces of data may be observed by running only a single test. Finally, because the contents of the output latches in each stage of the pipeline are sampled only once while the data of interest is at that stage, the clock may be left to free-run, or may be run for any number of cycles greater than the length of the pipeline.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of observing pipelined circuitry, comprising the steps of:
   (a) propagating a set of data through said pipelined circuitry while continuously clocking said pipelined circuitry, said pipelined circuitry comprising a plurality of stages, each of said plurality of stages having a set of outputs; and,
   (b) sampling each of said set of outputs of said plurality of stages as said set of data is propagated through each of said set of outputs.

2. The method of claim 1 wherein said pipelined circuitry is on an integrated circuit having the pipelined circuitry, test circuitry, and other circuitry, the pipelined circuitry being coupled to the test circuitry, and the pipelined circuitry being coupled to the other circuitry.

3. The method of claim 2 further comprising the step of isolating the pipelined circuitry from the other circuitry.

4. The method of claim 1 wherein the plurality of stages further comprises a plurality of latches.

5. The method of claim 4 wherein the plurality of stages further comprises combinational logic.

6. The method of claim 5 wherein the plurality of latches comprises the outputs of the plurality of stages.

7. The method of claim 6 wherein the plurality of stages has a set of inputs, the set of inputs being coupled to the outputs of a previous stage of the plurality of stages.

8. A method of observing pipelined circuitry, comprising the steps of:
   (a) propagating a plurality of sets of data through said pipelined circuitry while continuously clocking said pipelined circuitry, said pipelined circuitry comprising a plurality of stages, each of said plurality of stages having a set of outputs; and,
   (b) sampling each of said set of outputs of said plurality of stages as one of said plurality of sets of data is propagated through each of said set of outputs.

9. The method of claim 8 wherein said pipelined circuitry is on an integrated circuit having the pipelined circuitry, test circuitry, and other circuitry, the pipelined circuitry being coupled to the test circuitry, and the pipelined circuitry being coupled to the other circuitry.

10. The method of claim 9 further comprising the step of isolating the pipelined circuitry from the other circuitry.

11. The method of claim 8 wherein the plurality of stages further comprises a plurality of latches.

12. The method of claim 11 wherein the plurality of stages further comprises combinational logic.

13. The method of claim 12 wherein the plurality of latches comprises the outputs of the plurality of stages.

14. The method of claim 13 wherein the plurality of stages has a set of inputs, the set of inputs being coupled to the outputs of a previous stage of the plurality of stages.

15. An apparatus for observing the operation of pipelined circuitry on a set of inputs, said pipelined circuitry having a plurality of stages, said set of inputs being propagated by said pipelined circuitry to each of said plurality of stages of said pipeline while said pipelined circuitry is being continuously clocked, and each of said plurality of stages having a set of outputs, comprising:

a plurality of scan registers, each scan register coupled to said set of outputs of one of said plurality of stages of said pipeline;

a test clock controller coupled to each of said plurality of scan registers wherein said test clock controller causes each of said plurality of scan registers to sample the set of outputs of said one of said plurality of stages of said pipeline when said set of inputs is at said set of outputs of said one of said plurality of stages.

* * * * *